United States Patent
Richards

(10) Patent No.: US 7,830,733 B2
(45) Date of Patent: *Nov. 9, 2010

(54) DEVICES, SYSTEMS, AND METHODS FOR INDEPENDENT OUTPUT DRIVE STRENGTHS

(75) Inventor: Randon Richards, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/538,559

(22) Filed: Aug. 10, 2009

(65) Prior Publication Data

US 2009/0296502 A1    Dec. 3, 2009

Related U.S. Application Data

(63) Continuation of application No. 11/862,684, filed on Sep. 27, 2007, now Pat. No. 7,586,799.

(51) Int. Cl.
*G11C 7/00* (2006.01)
(52) U.S. Cl. .............. 365/193; 365/189.11; 365/230.06
(58) Field of Classification Search .................. 365/198
See application file for complete search history.

(56) References Cited

U.S. PATENT DOCUMENTS

| | | | |
|---|---|---|---|
| 6,832,177 B2 | 12/2004 | Khandekar et al. | |
| 6,859,412 B1 | 2/2005 | Kwack et al. | |
| 6,885,959 B2 | 4/2005 | Salamon et al. | |
| 6,903,994 B1 | 6/2005 | Schoenfeld | |
| 6,977,864 B2 | 12/2005 | Koo | |
| 6,980,042 B2 | 12/2005 | LaBerge | |
| 7,076,677 B2 | 7/2006 | Falconer et al. | |
| 7,161,851 B2 | 1/2007 | Peterson et al. | |
| 7,230,857 B2 | 6/2007 | Hynn et al. | |
| 7,586,799 B2 * | 9/2009 | Richards | 365/193 |
| 2005/0007835 A1 | 1/2005 | Lee et al. | |
| 2006/0029175 A1 | 2/2006 | Schnarr | |
| 2006/0125516 A1 | 6/2006 | Blodgett et al. | |
| 2006/0161745 A1 | 7/2006 | Lee et al. | |
| 2006/0262611 A1 | 11/2006 | Lee et al. | |
| 2009/0086562 A1 | 4/2009 | Richards | |

* cited by examiner

*Primary Examiner*—Tan T. Nguyen
(74) *Attorney, Agent, or Firm*—TraskBritt

(57) ABSTRACT

Methods, apparatuses and systems are disclosed for independently configurable data and strobe drivers within a memory device. A memory device may include at least one data driver and at least one strobe driver. The memory device may further include at least one mode register adapted to program a drive strength of the at least one data driver with a first plurality of control bits and a drive strength of the at least one strobe driver with a second plurality of control bits.

20 Claims, 9 Drawing Sheets

DEVICES, SYSTEMS, AND METHODS FOR INDEPENDENT OUTPUT DRIVE STRENGTHS

CROSS-REFERENCE TO RELATED APPLICATION

This application is a continuation of application Ser. No. 11/862,684, filed Sep. 27, 2007, now U.S. Pat. No. 7,586,799, issued Sep. 8, 2009. The disclosure of the aforementioned patent application is incorporated by reference herein in its entirety.

FIELD OF THE INVENTION

One or more embodiments of the present invention relate to data drivers and strobe drivers within memory devices. More particularly, one or more embodiments of the present invention relate to independent drive strengths of data and strobe drivers within memory devices.

BACKGROUND

Existing computer systems conventionally transfer data between devices, such as a memory controller and a memory device, in accordance with periodic signals and a predefined clocking scheme. Clock signals may be used to establish the timing of a transmitted signal or the timing at which an operation is performed on the signal. For example, data may be transferred to and from devices, such as a double-data rate synchronous dynamic random access memory (DDR SDRAM) device, in a source synchronous manner (i.e., the transmitting and receiving devices operate synchronously, in order to increase the speed of data transmission). In a source synchronous scheme, one or more strobe (clock) signals are transmitted along with a data signal along a transmission path. At a receiving device, the data signals are latched with reference to the strobe signal.

In a conventional DDR SDRAM, a data driver receives an internal data signal and outputs the data signal in response to being clocked by an internal clock signal. Ideally, the data driver outputs the data signal on an electrical interconnect in synchronism with a data strobe signal generated by a strobe driver. As required by a specific application, data drivers and strobe drivers may be programmed to operate in one of many drive strength modes (e.g., half, quarter, and one-eighth drive strength). A memory controller typically sets the output drive strength through the extended load mode register via a load mode register command to thereby place the data drivers and strobe drivers in the desired operating mode.

As shown in FIG. 1, a conventional memory system 100 may include a memory 102 and a memory controller 104. Memory 102 may include a plurality of data drivers 110 configured to transmit and receive data across a data bus 112. Furthermore, memory 102 may include one or more strobe drivers 114 configured to transmit and receive strobe signals across a strobe transmission line 108. Memory controller 104 may also transmit a plurality of commands over control bus 116. For example, control bus 116 may transmit a load mode register command including a desired drive strength to be programmed to drivers within memory 102. Extended mode register 120 may then set the drive strength accordingly for all data drivers 110 and strobe drivers 114 within memory 102. As shown in FIG. 1, conventional memories include one set of configured bits for setting data drivers 110 and strobe drivers 114.

As known in the art, an incoming strobe signal should transition through a threshold region in a smooth, linear manner. If a strobe signal changes direction within the threshold region or ledges (i.e., flat lines), a receiving circuit within a receiving device may register multiple data bits within a single clock period which may invalidate the data sequence or cause a system failure. Furthermore, as known in the art, the transition of data signals through the threshold region is inconsequential so long as setup and hold requirements are met (i.e., data signals must remain out of the threshold region as a strobe signal transitions through the threshold region).

For example, FIG. 2 illustrates a plot of a signal 103 driven by a driver operating in a half-strength mode. As known in the art, signal 103 may be a strobe signal or a data signal. If signal 103 is representative of a strobe signal, non-monotonic behavior requirements are violated (i.e., it does not transition through threshold region 105 in a smooth, linear fashion) at point 106. Conversely, if signal 103 is a data signal, and so long as setup and hold requirements are met, signal 103 may be a valid data signal.

Conventionally, data and strobe driver strengths are applied uniformly to all data and strobe drivers within a single memory device and, therefore, all data and strobe drivers operate at the same drive strength. However, strobe signals may experience problems when generated by drivers operating at lower drive strengths and, thus, strobe drivers operating at stronger drive strengths may be desirable. On the other hand, data signals may still meet all timing and signal quality requirements while being driven by drivers operating at lower drive strengths.

In view of the differing signal strength requirements for strobe and data drivers, methods, systems, and apparatuses having a capability for separately programmable data drivers and strobe drivers within a device, such as a memory device would be desirable. Specifically, it would be desirable to implement a device operable with data drivers and strobe drivers that may be programmed to operate at independent drive strengths.

DETAILED DESCRIPTION

In the following detailed description, reference is made to the accompanying drawings which form a part hereof and, in which is shown by way of illustration, specific embodiments in which the invention may be practiced. These embodiments are described in sufficient detail to enable those of ordinary skill in the art to practice the invention, and it is to be understood that other embodiments may be utilized, and that structural, logical, and electrical changes may be made within the scope of the present invention.

The term "bus" is used to refer to a plurality of signals or conductors, which may be used to transfer one or more various types of information, such as data, addresses, control, or status. Additionally, a bus or a collection of signals may be referred to in the singular as a signal. Some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

In this description, circuits and functions may be shown in block diagram form in order not to obscure the present invention in unnecessary detail. Furthermore, specific circuit implementations shown and described are only examples and should not be construed as the only way to implement the present invention unless specified otherwise herein. Block definitions and partitioning of logic between various blocks represent a specific implementation. It will be readily apparent to one of ordinary skill in the art that the various embodiments of the present invention may be practiced by numerous other partitioning solutions. For the most part, details concerning timing considerations, and the like, have been omitted where such details are not necessary to obtain a complete understanding of the present invention in its various embodiments and are within the abilities of persons of ordinary skill in the relevant art.

Figure 1:
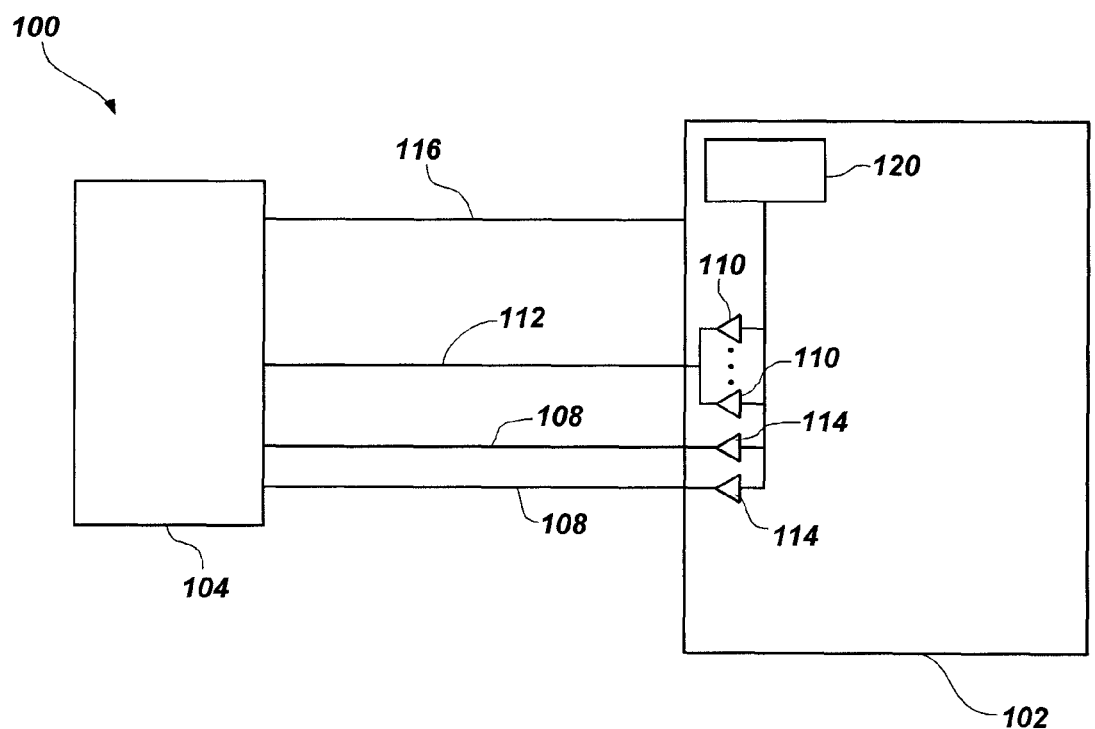
FIG. 1 is a block diagram of a conventional memory system including a memory device and a memory controller.
Figure 2:
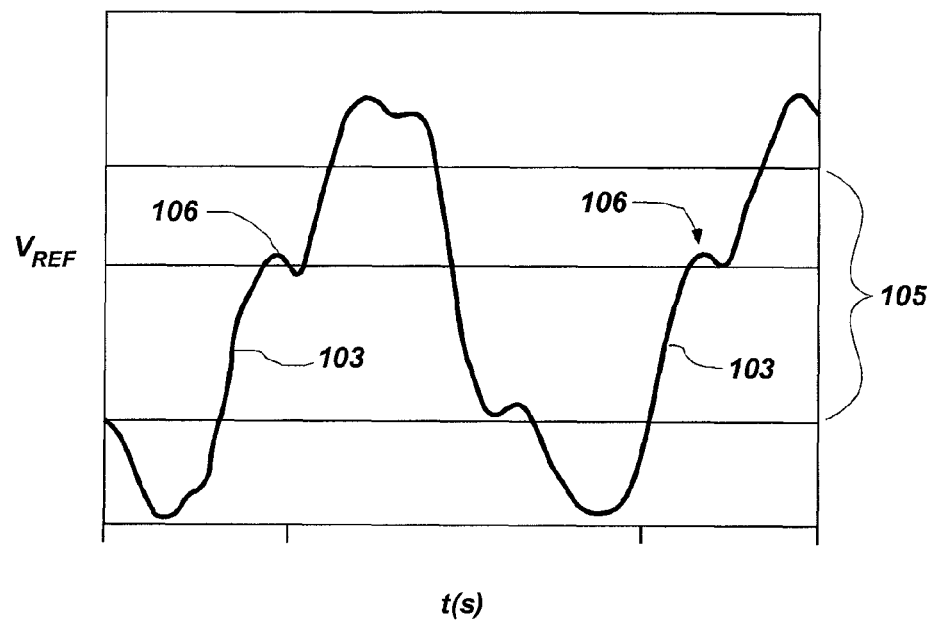
FIG. 2 illustrates a waveform driven by a driver operating in a half-strength mode.
Figure 3:
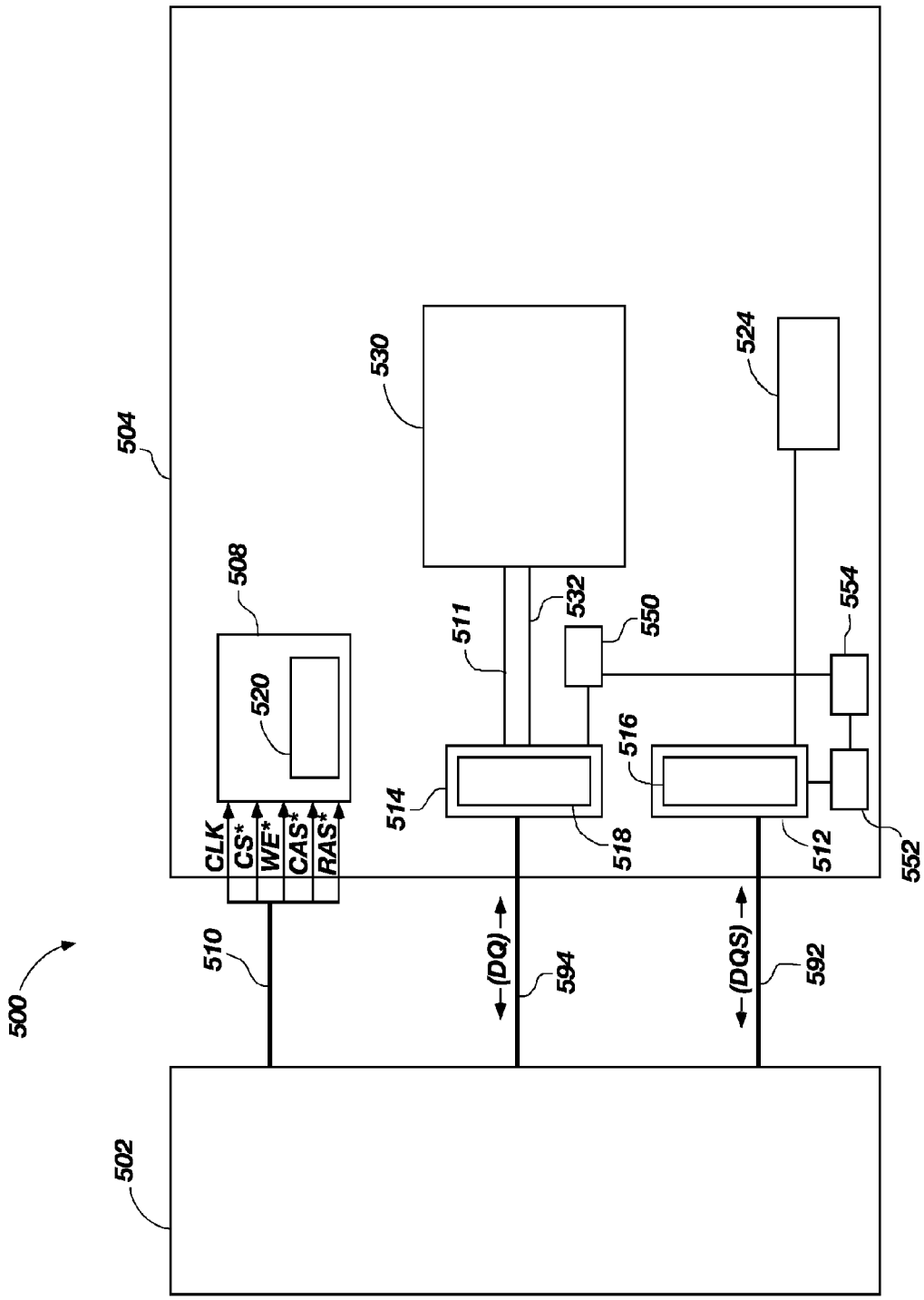
FIG. 3 is a block diagram of a memory system including a memory device and a memory controller, according to an embodiment of the present invention.

Before describing the data drivers and strobe drivers having independently programmable drive strengths in more detail, the various components of an embodiment of a memory device 504 will first be described. FIG. 3 is a block diagram of a memory system 500 including a memory controller 502 coupled to a memory device 504 that includes independently configurable data drivers and strobe drivers, in accordance with various embodiments of the present invention. In the following description, certain details are set forth to provide a sufficient understanding of the invention. It will be clear to one of ordinary skill in the art, however, that the invention may be practiced without these particular details. In FIG. 3, well-known circuits, device components, control signals, timing protocols, and software operations have not been shown in detail or omitted entirely in order to avoid unnecessarily obscuring the invention.

Memory device 504 may be a dynamic random access memory (DRAM) device or a static random access memory (SRAM) device. Examples of DRAM devices include synchronous DRAM (SDRAM), synchronous graphics random access memory (SGRAM), various generations of double data rate SDRAM (DDR SDRAM), various generations of Graphic Double Data Rate DRAM (GDDR DRAM), and RAMBUS® DRAM devices.

Memory device 504 may include a memory array 530 having a plurality of memory cells (not shown) for storing data. A control circuit 508 controls the operations of memory device 504 in response to control signals on control bus 510. Examples of the control signals on control bus 510 include a Row Access Strobe signal RAS*, a Column Access Strobe signal CAS*, a Write Enable signal WE*, a Chip Select signal CS*, and a Clock signal CLK. Examples of the operations of memory device 504 include a read operation and a write operation. Furthermore, control circuit 508 includes a mode register 520 configured to store values representing operating codes of memory device 504. One relevant example of an operating code includes a drive strength for data drivers and strobe drivers.

Additionally, memory device 504 may include a strobe transceiver circuit 512 and a data transceiver circuit 514. Strobe transceiver circuit 512 may include one or more strobe drivers 516 and may be configured to transfer timing information of the data transferred from memory device 504. Data transceiver circuit 514 may include one or more data drivers 518 and may be configured to transfer data to and from memory device 504. Data bus 594 may carry both input data provided to memory device 504 by an external source, such as memory controller 502, and output data outputted from memory device 504. Furthermore, strobe bus 592 may carry both input and output strobe signals sent to and from memory device 504.

During data write operations, memory controller 502 may transmit data signals DQ and strobe signals DQS to memory device 504 via data bus 594 and strobe bus 592, respectively. As known in the art, data words carried by data signals DQ are latched in response to strobe signals DQS. Data transceiver circuit 514 then transfers the input data to memory array 530 via input path 511.

During data read operations, data being read from memory array 530 may be provided to data transceiver circuit 514 via output path 532. Data transceiver circuit 514 may also receive a clock signal from a clock generator 550 in order to synchronize data drivers 518. Furthermore, strobe transceiver circuit 512 may receive a data strobe signal from a strobe signal generator 524 and a clock signal from clock generator 552. Clock generators 550/552 are coupled to receive a delayed clock signal from a delay locked loop (DLL) 554. As known in the art, a DLL can be used to generate a clock signal that is in synchronicity with another clock signal. Thereafter, in response to the clock signal, data transceiver circuit 514 and strobe transceiver circuit 512 may output data signals DQ and strobe signals DQS to memory controller 502 via data bus 594 and strobe bus 592, respectively. As known in the art, during read operations, memory controller 502 latches each data word carried by data signal DQ in response to data strobe signals DQS.

Figure 4A:
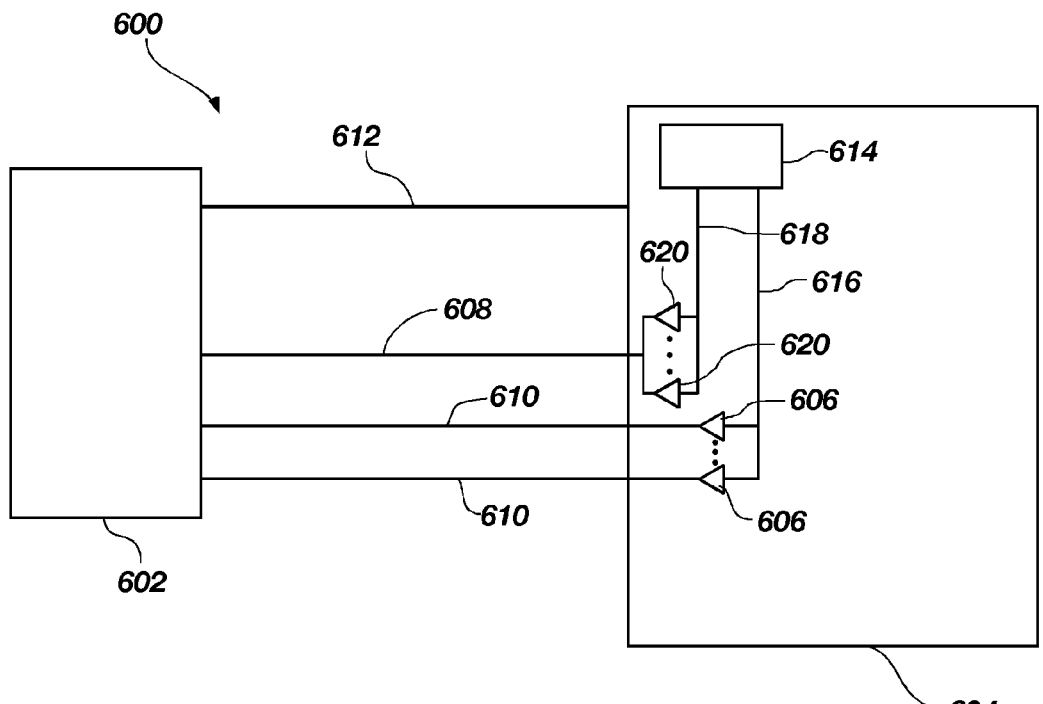
FIGS. 4A, 4B, and 4C are block diagrams of a memory system including a memory device, a memory controller, and transmission lines, in accordance with an embodiment of the present invention.

FIG. 4A illustrates a memory system 600 including a memory 604 and a memory controller 602. Memory 604 may include a plurality of data drivers 620 configured to transmit and receive data signals across a data bus 608. Furthermore, memory 604 may include one or more strobe drivers 606 configured to transmit and receive strobe signals across a strobe transmission line 610. Memory controller 602 may also transmit a plurality of command signals over a control bus 612, such as a plurality of load mode register commands including desired drive strengths for data drivers and strobe drivers within memory 604. Upon receiving a load mode register command with a desired drive strength, extended mode register 614 may set the drive strength accordingly for all data drivers and strobe drivers within memory 604. As shown in FIG. 4A, memory 604 includes independent internal signals 616 and 618 used for programming drive strengths of strobe drivers 606 and data drivers 620, respectively.

Figure 4B:
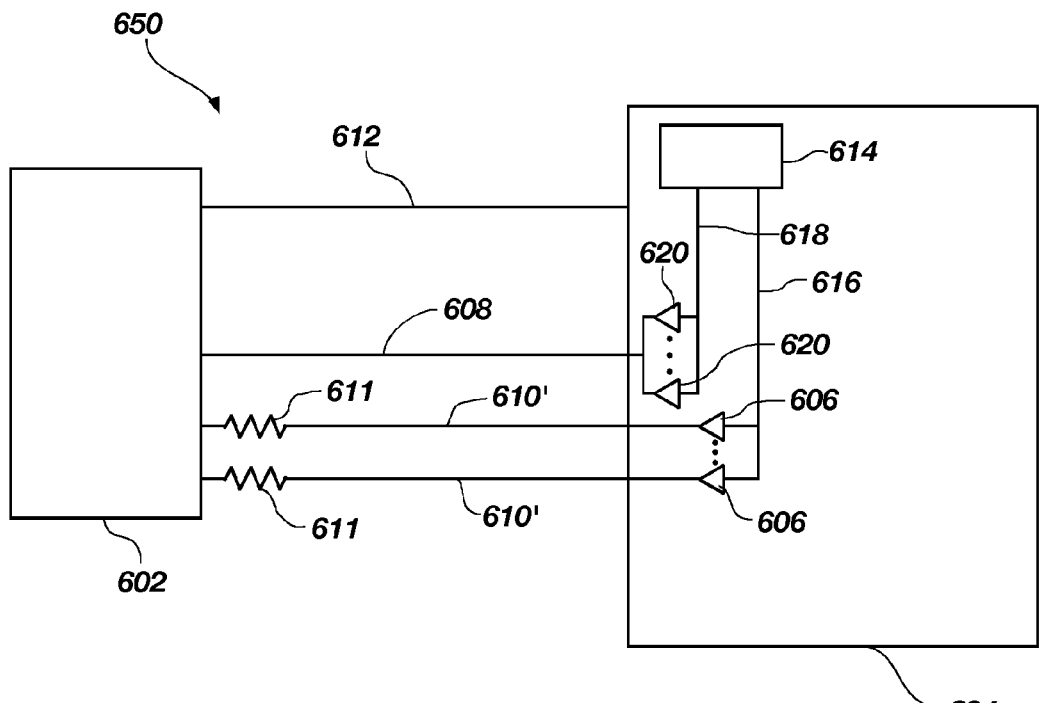

FIG. 4B illustrates a memory system 650 including memory 604 and memory controller 602. Memory system 650 is similar to memory system 600 illustrated in FIG. 4A except that each strobe transmission line 610' includes a resistive element 611. By way of nonlimiting example, resistive element 611 may comprise a resistor and may be implemented in order to limit overshoot and ring back violations that may occur in signals driven by drivers operating at higher strengths.

Figure 4C:
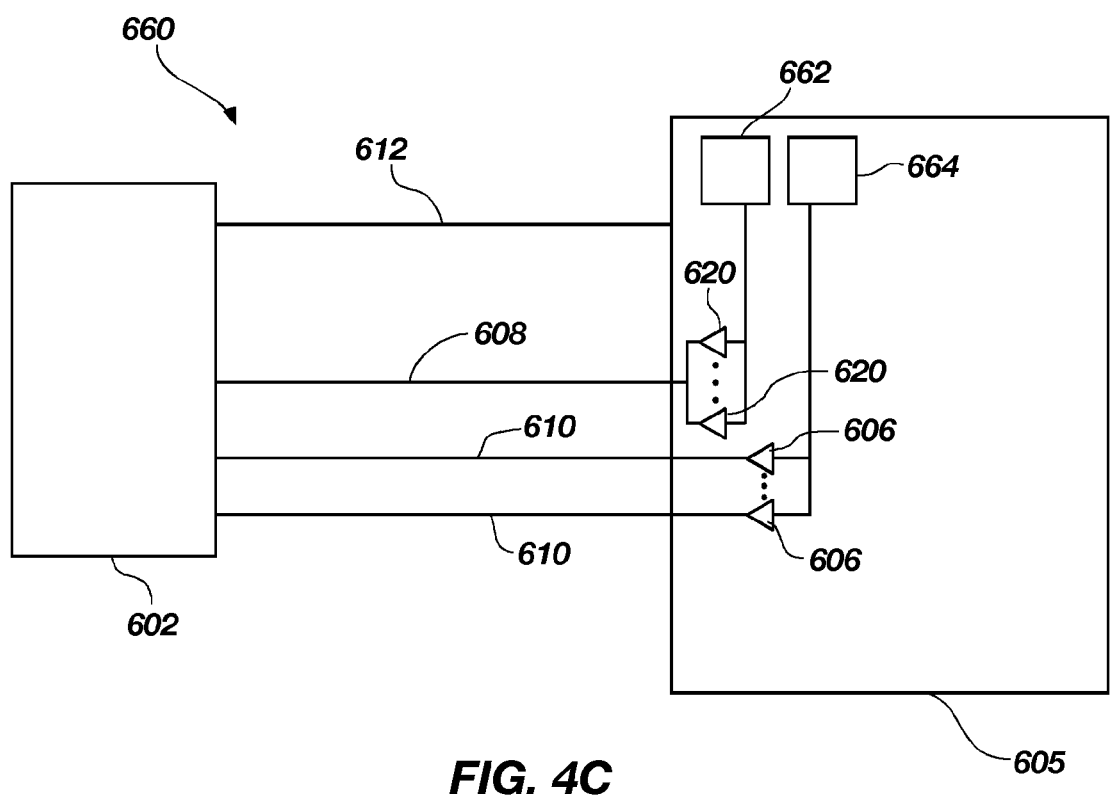

FIG. 4C illustrates a memory system 660 including memory 605 and memory controller 602. Memory system 660 is similar to memory systems 600, 650 illustrated in FIGS. 4A and 4B, respectively, except that memory 605 includes one extended mode register 662 configured to program data drivers 620 to a data drive strength and another extended mode register 664 configured to program strobe drivers 606 to a strobe drive strength.

Figure 5A:
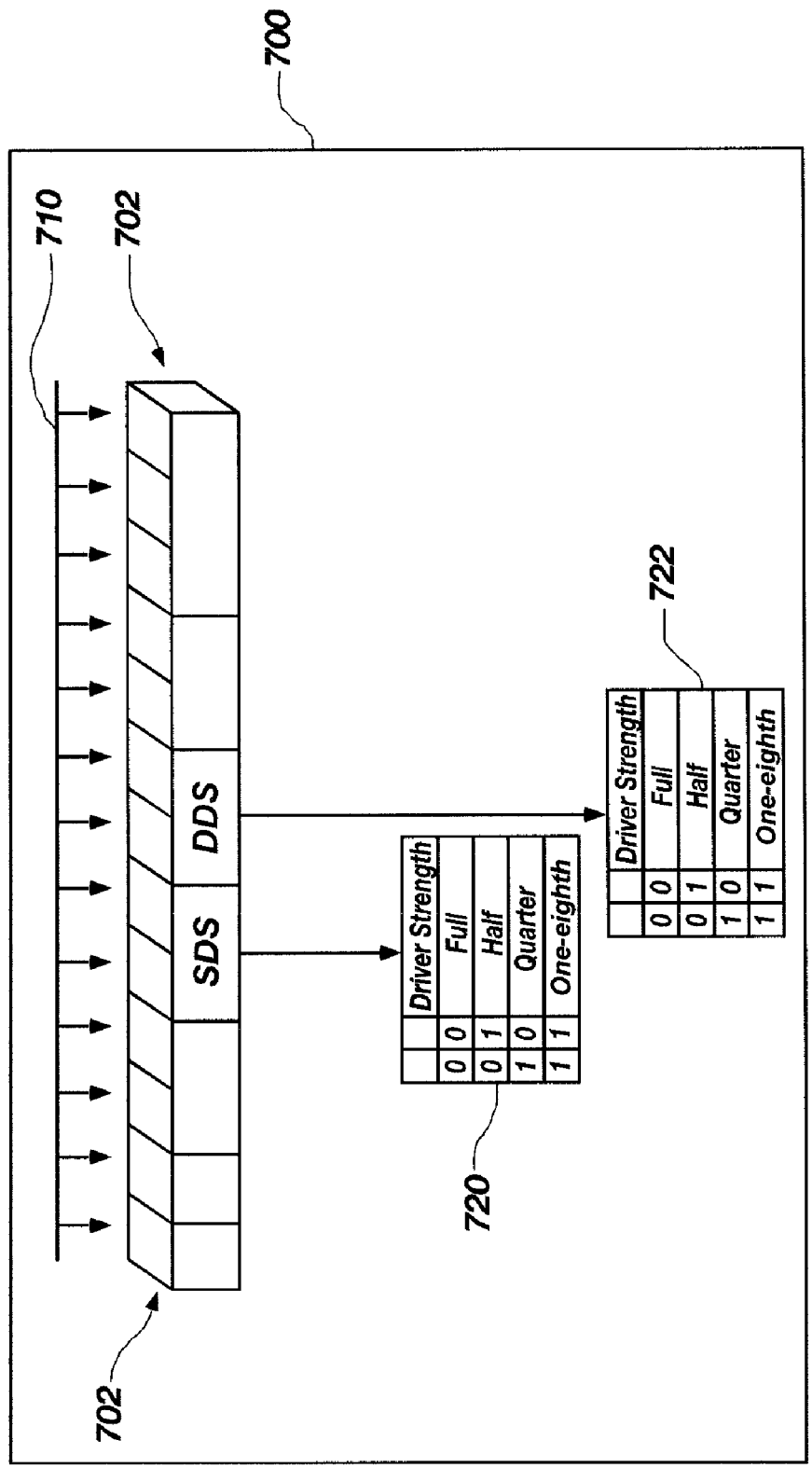
FIGS. 5A and 5B are examples of extended mode registers having independent control bits for data drivers and strobe drivers, in accordance with an embodiment of the present invention.
Figure 5B:
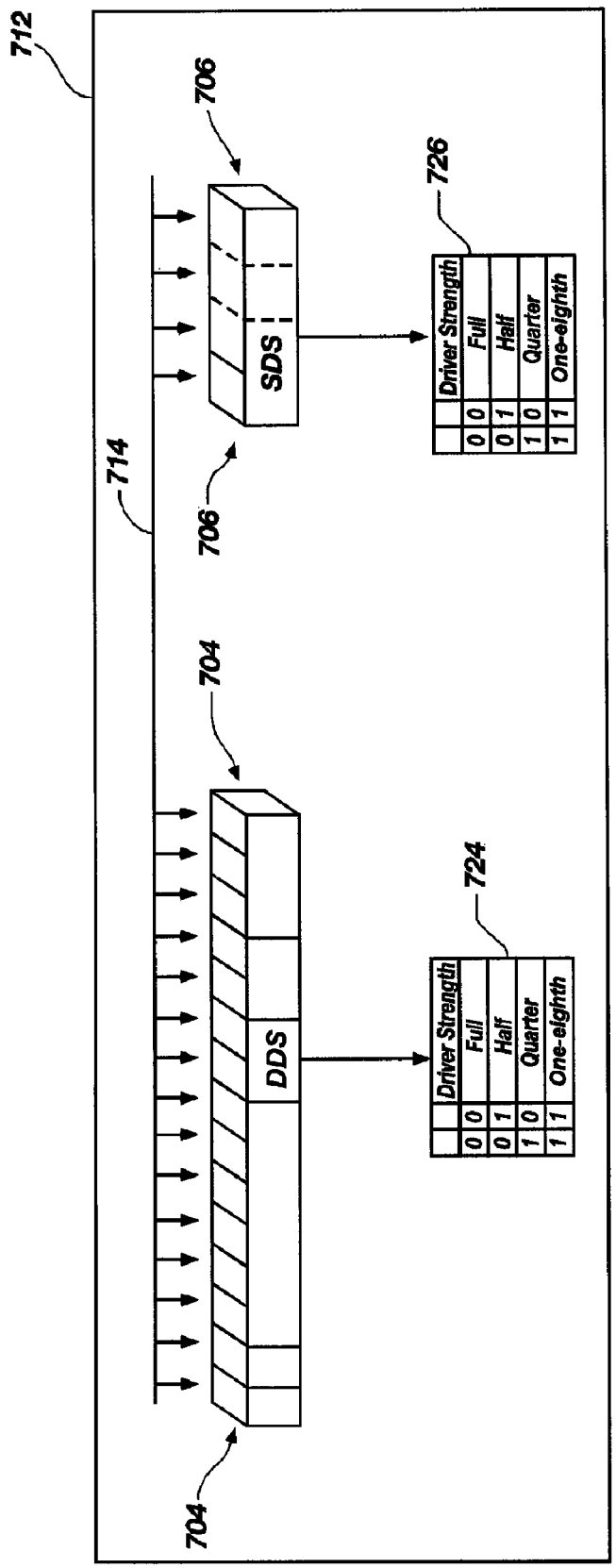

As is known in the art, conventional extended mode registers may be configured to program drive strengths of data drivers and strobe drivers within a memory. Using, for example, two control bits, data drivers and strobe drivers may be programmed to one of four possible, selected drive strengths. According to an embodiment of the present invention, in order to program strobe and data driver strengths independently, the use of extended mode register 614 (see FIGS. 4A and 4B) may be modified, such as by using available or "free" bits to set a strobe driver strength setting. In yet another embodiment, extended mode register 614 may be modified by, for example, adding two more bits that may be used to set a strobe driver strength setting. FIG. 5A illustrates a control device 700 including an address bus 710 and an extended mode register 702. As illustrated, extended mode register 702 is configured to receive two control bits to set a strobe driver strength SDS 720 and two control bits to set a data driver strength DDS 722. Furthermore, in another embodiment, an additional extended mode register may be added to memory 604 in order to set a strobe driver strength setting. FIG. 5B illustrates a control device 712 having an address bus 714 and an extended mode register 704 configured to receive two control bits to set a data driver strength DDS 724. In addition, control device 712 includes an additional extended mode register 706 configured to receive two control bits to set a strobe driver strength SDS 726.

Modifying an existing mode register or providing an additional mode register may be effected to provide greater flexibility in programming data and strobe drivers. For example, with an extended mode register having two control bits reserved for data drive strength, the data drivers may be programmed in one of four possible drive strengths. Moreover, with an extended mode register having two control bits reserved for strobe drive strength, the strobe drivers may be independently programmed in one of four different drive strengths. Additionally, using an additional extended mode register, and depending on the number of control bits available, more or less than four possible, selected drive strengths may be available for the strobe drivers (e.g., with an additional extended mode register having three control bits, a strobe driver may be set to one of eight possible, selected drive strengths).

A contemplated operation of memory system 600, 650, 660 will now be described. According to the embodiments of FIGS. 4A and 4B, memory controller 602 may transmit a load mode register command including desired drive strength values for data drivers 620 and strobe drivers 606 to extended mode register 614. Extended mode register 614 may then independently program data drivers 620 to a data drive strength and strobe drivers 606 to a strobe drive strength. After being set with a drive strength, data drivers 620 and strobe drivers 606 may transmit data signals and strobe signals driven by independent drive strengths to memory controller 602 utilizing strobing techniques as known in the art. Furthermore, data signals and strobe signals transmitted from memory controller 602 may be received at data drivers 620 and strobe drivers 606, respectively.

In another embodiment of FIG. 4C, memory controller 602 may transmit a load mode register command including a desired data drive strength to extended mode register 662. Memory controller 602 may also transmit a load mode register command including a desired strobe drive strength to extended mode register 664. Thereafter, extended mode register 662 may program data drivers and extended mode register 664 may program strobe drivers accordingly. Subsequently, data drivers 620 and strobe drivers 606 may transmit data signals and strobe signals driven by independent drive strengths to memory controller 602 utilizing strobing techniques as known in the art.

Figure 6A:
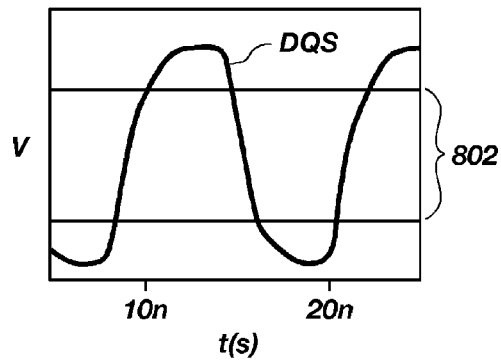
FIGS. 6A, 6B, 6C, and 6D illustrate strobe signals and data signals driven by independent drive strengths, according to an embodiment of the present invention.

FIGS. 6A-6D illustrate strobe signals DQS and data signals DQ driven by independent drive strengths. Specifically, FIG. 6A illustrates a strobe signal DQS driven by a strobe driver operating at full-strength and received at a device, such as a memory controller. Furthermore, a transmission line from which strobe signal DQS was transmitted includes a resistive element (see FIG. 4B) in order to limit overshoot and ring back behavior, as described above. As shown in FIG. 6A, strobe signal DQS transitions through a threshold region 802 in a smooth, linear manner and, therefore, non-monotonic requirements have been met. Furthermore, strobe signal DQS, as shown in FIG. 6A, represents a signal driven by what may be characterized as a "slow" driver due to process, voltage, and temperature (PVT) variations. As known by one having ordinary skill in the art, PVT variations may cause a driver to exhibit a high impedance or a slow slew rate.

Figure 6B:
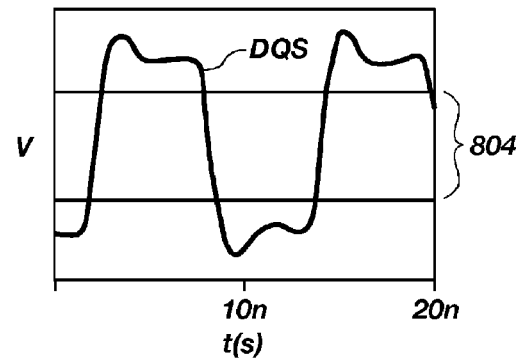

FIG. 6B also illustrates a strobe signal DQS driven by a strobe driver operating at fall-strength and received at a device, such as a memory controller. Furthermore, a transmission line from which strobe signal DQS was transmitted includes a resistive element (see FIG. 4B) in order to limit overshoot and ring back behavior. Furthermore, strobe signal DQS, as shown in FIG. 6B, represents a signal driven by what may be characterized as a "fast" driver due to the PVT variations that cause the driver to exhibit a low impedance or fast slew rate. As shown in FIG. 6B, strobe signal DQS transitions through a threshold region 804 in a smooth, linear fashion and, therefore, non-monotonic requirements have been met.

Figure 6C:
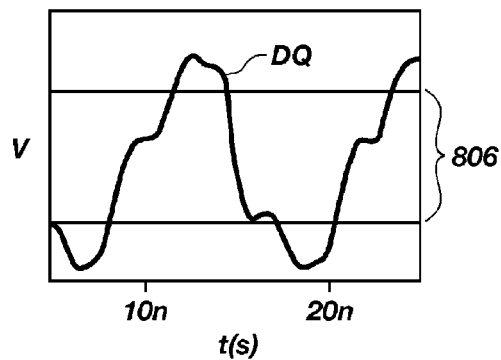

FIG. 6C illustrates a data signal DQ driven by a data driver operating at half-strength and received at a device, such as a memory controller. As shown in FIG. 6C, data signal DQ does not include overshoot or ring back characteristics. Furthermore, data signal DQ remains out of the threshold region 806 for a sufficient time in order to meet setup and hold requirements. Furthermore, strobe signal DQS, as shown in FIG. 6C, represents a signal driven by a "slow" driver due to the PVT variations that cause the driver to exhibit a high impedance or a slow slew rate.

Figure 6D:
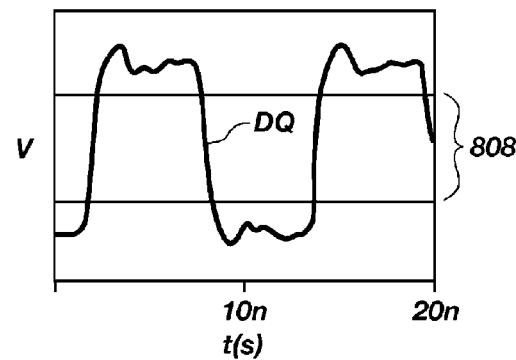

FIG. 6D also illustrates a data signal DQ driven by a data driver operating at half-strength and received at a device, such as a memory controller. Furthermore, data signal DQ, as shown in FIG. 6D, represents a signal driven by a "fast" driver due to the PVT variations that cause the driver to exhibit a low impedance or a fast slew rate. Like data signal DQ shown in FIG. 6C, the data signal DQ illustrated in FIG. 6D does not include overshoot or ring back characteristics. In addition, data signal DQ remains out of the threshold region 808 for a sufficient time in order to meet setup and hold requirements.

Configuring a memory device with independently programmable data and strobe drivers may reduce power consumption, improve system flexibility, and improve performance. For example, a customer may not only set drive strengths independently, but also a customer may choose from additional drive strength levels. Additionally, non-monotonic, overshoot, and ring back violation may be limited. Furthermore, because data drivers may operate at lower drive strengths, a memory system may not require a resistor in each data transmission line in order to limit overshoot and ring back violations of data signals.

Figure 7:
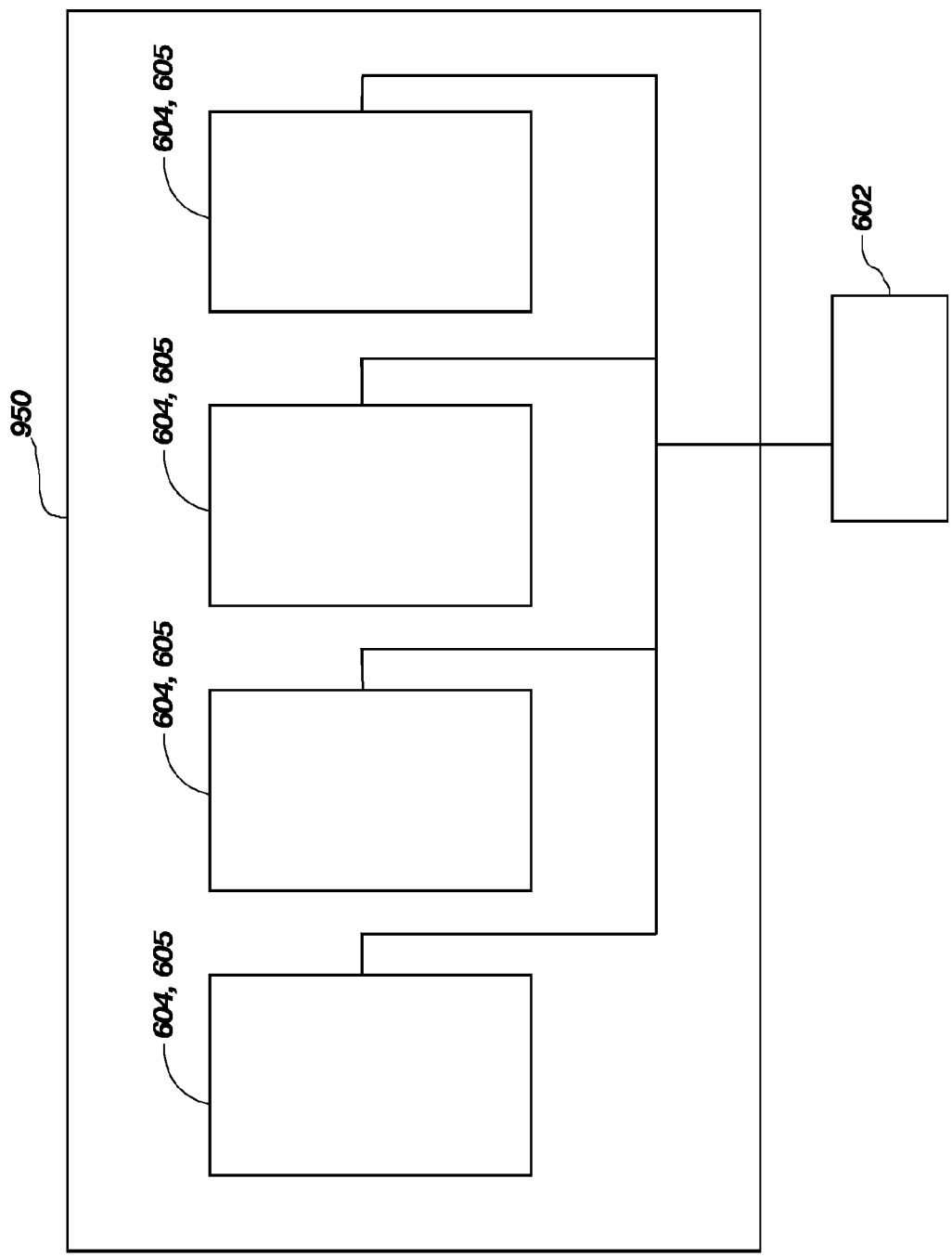
FIG. 7 is a block diagram of a memory module including multiple memory devices, in accordance with an embodiment of the present invention.

FIG. 7 illustrates a memory organization including memory module 950. Memory modules 950 may assume the form of various module configurations such as dual in-line memory module (DIMM), single in-line memory module (SIMM), RAMBUS® in-line memory module (RIMM), small outline dual in-line memory module (SODIMM), and triple in-line memory module (TRIMM), or other defined module configurations. In addition, different types of DIMM modules may be used, such as DIMM configurations having enhanced data output (EDO) DRAMs or DIMM configurations having SDRAMs. Furthermore, the DIMM configurations may be single-sided or double-sided. Memory module 950 may comprise one or more memory devices 604, 605, each memory device 604, 605 comprising independently programmable data and strobe drivers according to an embodiment of the invention and having an input and output operably coupled to memory controller 602.

Figure 8:
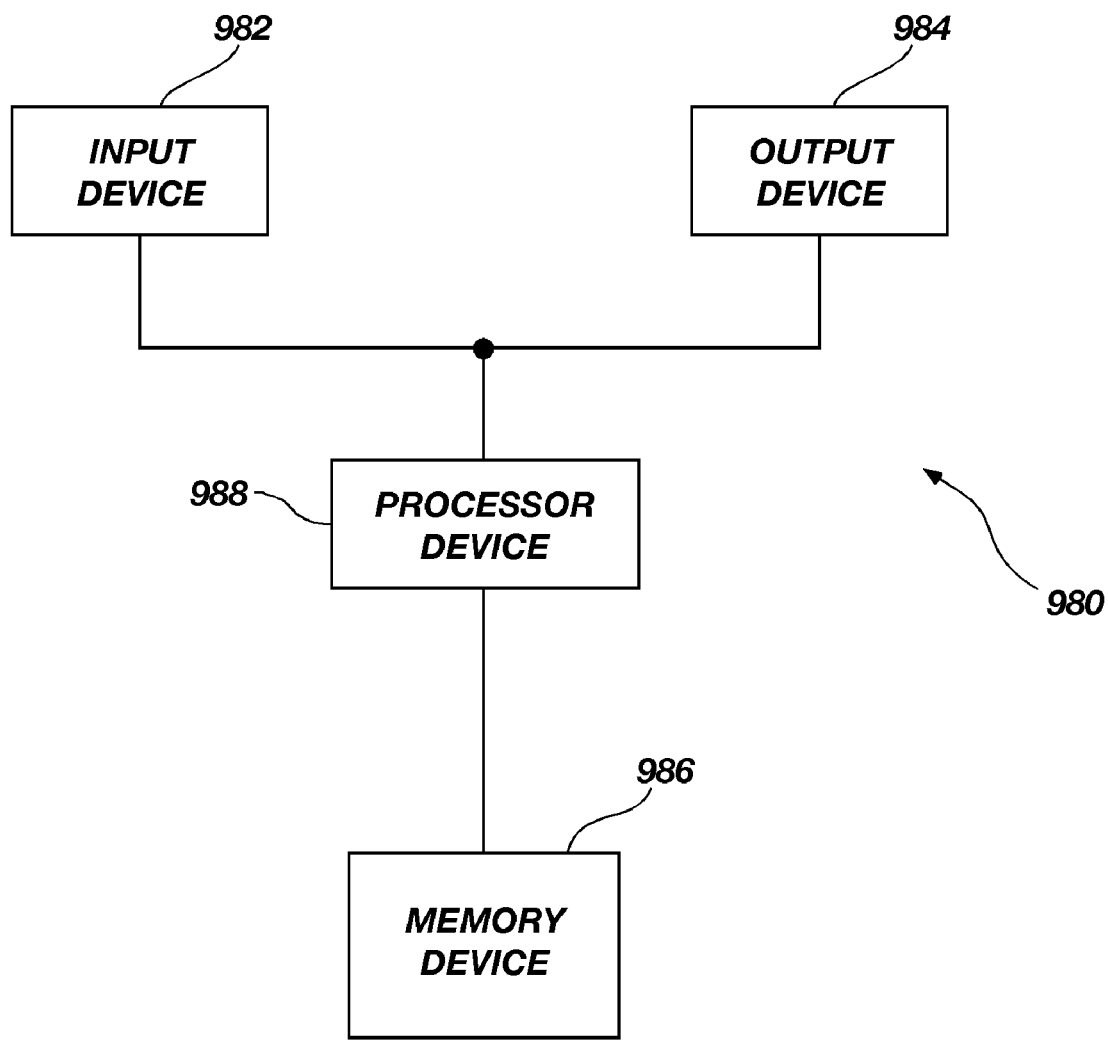
FIG. 8 is a block diagram illustrating an electronic system including a memory device, in accordance with an embodiment of the present invention.

As shown in FIG. 8, an electronic system 980 includes an input device 982, an output device 984 and a memory device 986 all coupled to a processor device 988. Memory device 986 may include an additional extended mode register or a modified extended mode register. Furthermore, memory device 986 may include independently configurable data and strobe drivers according to an embodiment of the invention as described herein above.

Specific embodiments have been shown by way of example in the drawings and have been described in detail herein; however, the various embodiments may be susceptible to various modifications and alternative forms. It should be understood that the invention is not intended to be limited to the particular forms disclosed. Rather, the invention includes all modifications, equivalents, and alternatives falling within the scope of the invention as defined by the following appended claims and their legal equivalents.

What is claimed is:

1. A memory device, comprising:
   at least one data driver;
   at least one strobe driver; and
   at least one mode register adapted to program a drive strength of the at least one data driver with a first plurality of control bits and a drive strength of the at least one strobe driver with a second plurality of control bits.

2. The memory device of claim 1, wherein the at least one mode register comprises a first mode register adapted to program the drive strength of the at least one data driver and a second mode register adapted to program the drive strength of the at least one strobe driver.

3. The memory device of claim 1, wherein the at least one mode register is adapted to program the drive strength of the at least one strobe driver to one of a plurality of drive strengths.

4. The memory device of claim 1, wherein the at least one mode register is adapted to program the drive strength of the at least one data driver to one of a plurality of drive strengths.

5. The memory device of claim 1, wherein the at least one data driver and the at least one strobe driver are independently coupled to the at least one mode register.

6. The memory device of claim 1, wherein a first mode register of the at least one mode register is operably coupled to the at least one data driver and a second mode register of the at least one mode register is operably coupled to the at least one strobe driver.

7. A memory system, comprising:
   at least one memory device, comprising:
      at least one data driver configured to be programmed to a data drive strength with a first plurality of control bits; and
      at least one strobe driver configured to be programmed to a strobe drive strength with a second plurality of control bits; and
   at least one strobe line configured for conveying a strobe signal between the at least one memory device and a memory controller.

8. The memory system of claim 7, wherein the at least one strobe line comprises a resistive element coupled between the at least one memory device and the memory controller.

9. The memory system of claim 7, wherein each data driver of the at least one data driver and each strobe driver of the at least one strobe driver is adapted to operate at one of a plurality of drive strengths.

10. A memory system, comprising:
    a memory controller; and
    at least one memory device operably coupled to the memory controller, the at least one memory device including:
       at least one data driver configured to be programmed to a data drive strength with at least two control bits; and
       at least one strobe driver configured to be programmed to a strobe drive strength with at least two other control bits.

11. The memory system of claim 10, further comprising at least one mode register configured to program the at least one data driver and the at least one strobe driver.

12. The memory system of claim 11, wherein the at least one mode register comprises a first mode register configured to program the at least one data driver to the data drive strength and a second mode register configured to program the at least one strobe driver to the strobe drive strength.

13. A method of operating a memory device, comprising:
    setting a data drive strength of at least one data driver with a first plurality of control bits; and
    setting a strobe drive strength of at least one strobe driver with a second plurality of control bits.

14. The method of claim 13, wherein setting a data drive strength of at least one data driver comprises setting a data drive strength of at least one data driver with a mode register.

15. The method of claim 13, wherein setting a strobe drive strength of at least one strobe driver comprises setting a strobe drive strength of at least one strobe driver with a mode register.

16. The method of claim 13, wherein setting a data drive strength of at least one data driver and setting a strobe drive strength of at least one strobe driver comprises setting a data drive strength of at least one data driver with a first mode register and setting a strobe drive strength of at least one strobe driver with a second mode register.

17. The method of claim 13, further comprising conveying a strobe signal across a strobe transmission line including a resistive element coupled between the memory device and a memory controller.

18. The method of claim 13, wherein setting a strobe drive strength of at least one strobe driver comprises setting a strobe drive strength of at least one strobe driver to one of a plurality of drive strengths.

19. The method of claim 13, wherein setting a data drive strength of at least one data driver comprises setting a data drive strength of at least one data driver to one of a plurality of drive strengths.

20. An electronic system, comprising:
   at least one processor; and
   at least one memory module, including at least one memory comprising:
   at least one extended mode register having a first plurality of control bits adapted to program at least one data driver to one of a plurality of data drive strengths and a second plurality of control bits adapted to program at least one strobe driver to one of a plurality of strobe drive strengths.

* * * * *